United States Patent [19]

Numata et al.

[11] 4,079,269

[45] Mar. 14, 1978

[54] SWITCH MEANS FOR CAMERAS

[75] Inventors: Saburo Numata; Shinichiro Fujino, both of Urawa, Japan

[73] Assignee: Fuji Photo Optical Co., Ltd., Omiya, Japan

[21] Appl. No.: 679,372

[22] Filed: Apr. 22, 1976

[30] Foreign Application Priority Data

Apr. 22, 1975 Japan .................................. 50-48840

[51] Int. Cl.$^2$ .............................................. H03K 17/16

[52] U.S. Cl. ................................ 307/247 A; 307/218; 307/308; 338/99; 338/114; 200/211; 200/264; 200/265

[58] Field of Search ............... 200/211, 264, 265, 262, 200/213, 212; 338/99, 114, 2, 5, 100; 307/218, 247 A, 308

[56] References Cited

U.S. PATENT DOCUMENTS

| | | | |
|---|---|---|---|
| 3,123,792 | 3/1964 | Klemm | 338/100 |
| 3,226,568 | 12/1965 | Samwel | 307/218 |
| 3,239,687 | 3/1966 | Steele | 307/218 |
| 3,386,067 | 5/1968 | Costanzo | 338/114 X |
| 3,588,525 | 6/1971 | Hatsukano et al. | 307/247 A |
| 3,758,733 | 9/1973 | Durocher et al. | 200/159 R |
| 3,875,434 | 4/1975 | Harden et al. | 307/308 |

*Primary Examiner*—John S. Heyman

[57] ABSTRACT

A switch means for electrically operating a device in a photographic camera is composed of a mechanical switch and a semiconductor switching element connected with the mechanical switch. The mechanical switch has a pair of contacts made of resilient conductive material and increases its conductivity as the pressure applied thereto increases. By the increase of the conductivity of the mechanical switch an input voltage supplied to the semiconductor switching element is raised and the switching element is turned on when the input voltage has reached a predetermined level. Thus, chattering and large consumption of electric power are prevented.

2 Claims, 3 Drawing Figures

SWITCH MEANS FOR CAMERAS

BACKGROUND OF THE INVENTION

1. Field of the Invention

This invention relates to an electric switch means, and more particularly to a switch means employed in a camera for controlling an exposure control circuit in the camera body.

2. Description of the Prior Art

In an automatic exposure control camera including an electric circuit for controlling exposure time, there is usually employed a mechanical switch consisting of a pair of electric contacts made of elastic conductive material each having an inwardly projecting portion near the free end thereof. This kind of mechanical switches are apt to cause malfunction owing to the particular structure thereof including the sharply formed projecting portions and/or the characteristics of the material which is liable to be oxidized or to which dusts and stains are liable to stick. Further, this kind of mechanical switches have a defect in that when they are manually operated they will chatter however softly may they be touched and it will usually take about 3 milliseconds for the switch to be stabilized. The chattering of the switch will cause malfunction of the exposure control circuit including the switch. Particularly, in the exposure control circuit associated with a complicated mechanism for controlling complicated shutter and other mechanisms in the camera in which a number of switches are operated in a short peiod for sequentially controlling various mechanism in a determined order, the chattering of switches is a serious problem which is concerned with the results of photographing.

In order to eliminate the malfunction of the switches, for instance, gold contacts are employed in some switches. However, this kind of improved switches are still disadvantageous in that the contact resistance thereof will increase as the time lapses and dusts and stains are likely to stick thereto and further the price thereof is high.

In addition, the conventional mechanical switches or sealed lead relay switches occupy a large space and consume electric current to some extent. The photographic cameras are desired to be made compact in size and small in weight as much as possible, and accordingly, it is undesirable that a complicated switch means occupying a large space be incorporated in a camera body. Further, the power consumption by the switches is desired to be made as small as possible.

SUMMARY OF THE INVENTION

In view of the above described defects inhereht in the conventional mechanical switches, the primary object of the present invention is to provide a switch means suitable for controlling an exposure control circuit in a camera which is free from chattering.

Another object of the present invention is to provide a switch means to which dusts or stains are not liable to stick.

Still another object of the present invention is to provide a switch means which does not occupy a large space.

A further object of the present invention is to provide a switch means which does not consume a large amount of electric current.

The switch means in accordance with the present invention is characterized in that a semiconductor switching element is connected at its input with a mechanical switch which has contacts made of an elastic material that changes its conductivity as the contact area thereof changes.

DESCRIPTION OF PREFERRED EMBODIMENTS

Figure 1:
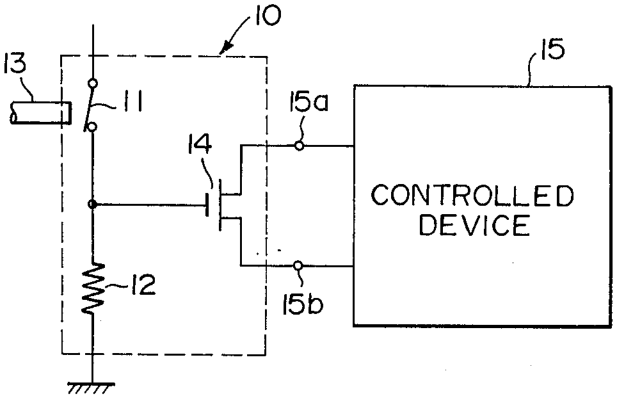
FIG. 1 is a diagram showing an embodiment of the switching means in accordance with the present invention.

Referring to FIG. 1 which shows an embodiment of the present invention, a switching means 10 is connected with an electric device 15 which is controlled by the switching means 10. The switching means 10 includes a mechanical switch 11 connected with a fixed resistor 12 which is in turn grounded. The mechanical switch 11 is associated with an operating member 13 which is manually operated to close the mechanical switch 11. A junction between the mechanical switch 11 and the resistor 12 is connected with a semiconductor switching element 14 such as a MOS (Metal-oxide-semiconductor) type FET. The semiconductor switching element 14 is connected with said electric device 15 to be controlled by way of two input terminals **15*a* and 15*b*** thereof.

Figure 3:
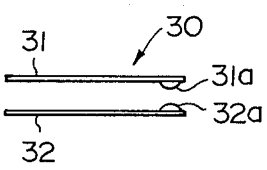
FIG. 3 is a partial side view showing an example of a mechanical switch employed in an embodiment of the present invention.

One example of the mechanical switch 11 employed in connection with the semiconductor switching element 14 is illustrated in FIG. 3. A mechanical switch 30 shown in FIG. 3 consists of a pair of elastic conductive members 31 and 32 each having on the inside surface thereof an electric contact **31*a* and 32*a* made of resilient conductive material. The resilient conductive material is for instance rubber which contains mixed therein granular crystalline carbons. The mechanical switch 31 has its conductivity at the contacts 31*a* and 32*a* changed as the contact area thereof changes, accordingly. Therefore, the amount of electric current flowing through the contacts 31*a* and 32*a* changes as the pressure at which the pair of conductive members 31 and 32** are pressed against each other.

In operation of the above described embodiment of the invention, the resilient conductive material constituting the cóntacts **31*a* and 32*a* is deformed to increase the contact area as the pressure exerted thereon by the manual operating member 13 increases. Thus, the conductivity of the switch 30 that is the resistance thereof is changed as the manual operating member 13 is depressed. The divided voltage at the junction between the mechanical switch 11 and the resistor 12 which is determined by the resistence of the switch 11 and that of the resistor 12 is, therefore, increased as the operating member 13 is depressed. When the potential at the junction reaches the gate voltage of the MOS type FET 14, the latter is turned ON to be conductive and serves to close a circuit of the device 15**.

Thus, the device 15 to be controlled is controlled by the semiconductor switching element 14 such as a MOS type FET which is controlled by an input voltage applied thereto. Since the input voltage of the semiconductor switching element 14 is controlled by the contact area of the mechanical switch 11 having resilient contacts 31*a* and 32*a*, there is no fear of causing chattering of the switching means 10 since the contact area of the resilient contacts 31*a* and 32*b* will normally increase smoothly as the pressure increases while absorbing a minute vibration of the elastic members 31 and 32.

Figure 2:
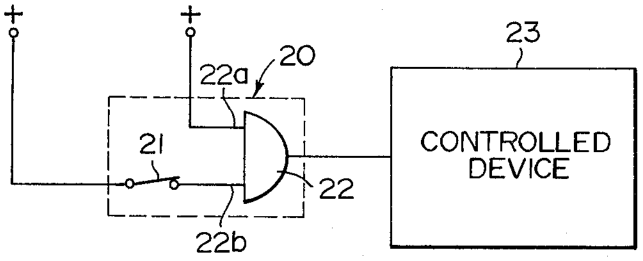
FIG. 2 is a diagram showing another embodiment of the switching means in accordance with the present invention.

A second embodiment of the present invention will be described hereinbelow with reference to FIG. 2. In this embodiment, an AND gate 22 is employed as a semiconductor switching element connected in series with a mechanical switch 21 as said switch 11 in FIG. 1. A switching means 20 in accordance with this embodiment consists of a mechanical switch 21 which has the same structure as said switch 30 as shown in FIG. 3 and an AND circuit 22 one input of which is connected with the mechanical switch 21. In this embodiment also, the semiconductor switching element 22 is turned ON when the contact area which corresponds to the resistance or conductivity of the mechanical switch 21 has reached a predetermined level which is determined with respect to the switching element 22. As is well known in the art, two inputs 22*a* and 22*b* of the AND gate 22 are both supplied with a positive input and the AND gate 22 gives a positive output only when the level of the two inputs is higher than a predetermined level. One input 22*a* is normally supplied with a constant input voltage and the second input 22*b* connected with the mechanical switch 21 is supplied with a voltage of over a predetermined level only when the contact area of the mechanical switch 21 has reached a predetermined level.

In the above described embodiment also, the semiconductor switching element 22 is turned ON by the increase in the conductivity of a mechanical switch 21. Therefore, there is no fear of causing chattering of the switching means 20.

Further, in both of the above-described embodiments of the invention, the influence of dusts or the like existing on the contacts of the mechanical switch is negligibly small since the change in resistance of the contacts effected by the dusts or the like is very small in comparison with the change in resistance thereof accompanying its turning ON and OFF operation. Further, since there flows very little current through the MOS type FET 14, the consumption of electric power is considerably small.

Therefore, the switching means in accordance with the present invention can be roughly mounted in a camera body. This switching means is very suitable, therefore, to be provided in a camera body to be operated by various mechanical members such as a swing mirror, shutter blinds and other movable members in a camera body.

It will be noted by those skilled in the art that a number of switching means in accordance with this invention can be employed in the state where the number of switching means are connected in parallel or series to operate a number of circuits in the camera body.

We claim:

1. A switch means for turning on and off an electric circuit provided in a photographic camera body including a manually operable mechanical switch composed of a pair of contact members and an electrical switching element connected with said mechanical switch to be operated thereby, wherein the improvement comprises a first contact made of a resilient conductive material and disposed on one of said contact members, and a second contact made of a resilient conductive material and disposed on the other of said contact members opposite to said first contact, said first and second contacts each having a curved external surface configuration such that the contact area thereof progressively increases when the first and second contacts are pressed against each other and are progressively deformed.

2. A switch means as defined in claim 1, wherein said resilient conductive contact is made of rubber containing granular crystalline carbons mixed therein, the carbons being contacted with one another in the rubber.

* * * * *